(12) United States Patent
Tsuchiya

(10) Patent No.: US 10,535,476 B2
(45) Date of Patent: Jan. 14, 2020

(54) ELECTRONIC DEVICE

(71) Applicant: KYOCERA Corporation, Kyoto (JP)

(72) Inventor: Tomoki Tsuchiya, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/086,569

(22) PCT Filed: Mar. 23, 2017

(86) PCT No.: PCT/JP2017/011732
§ 371 (c)(1),
(2) Date: Sep. 19, 2018

(87) PCT Pub. No.: WO2017/164311
PCT Pub. Date: Sep. 28, 2017

(65) Prior Publication Data
US 2019/0108951 A1    Apr. 11, 2019

(30) Foreign Application Priority Data
Mar. 25, 2016    (JP) ................. 2016-061538

(51) Int. Cl.
| | |
|---|---|
| *H01H 9/04* | (2006.01) |
| *H01H 13/06* | (2006.01) |
| *H05K 5/00* | (2006.01) |
| *G06F 1/16* | (2006.01) |
| *H05K 5/03* | (2006.01) |

(52) U.S. Cl.
CPC ............ *H01H 9/04* (2013.01); *G06F 1/1633* (2013.01); *H01H 13/06* (2013.01); *H05K 5/0017* (2013.01); *H05K 5/03* (2013.01)

(58) Field of Classification Search
CPC ......... H01H 9/04; H01H 13/06; G06F 1/1633
USPC ......................................................... 200/293
See application file for complete search history.

(56) References Cited

FOREIGN PATENT DOCUMENTS

| | | | | |
|---|---|---|---|---|
| JP | H09-129079 | * | 5/1997 | ............. H01H 13/06 |
| JP | H09-129079 A | | 5/1997 | |
| JP | 2014-120203 A | | 6/2014 | |
| WO | 2014/092117 A1 | | 6/2014 | |
| WO | WO2014092117 | * | 6/2014 | ............. H04H 10/02 |

* cited by examiner

*Primary Examiner* — Edwin A. Leon
*Assistant Examiner* — Iman Malakooti
(74) *Attorney, Agent, or Firm* — Studebaker & Brackett PC

(57) ABSTRACT

An electronic device includes a housing including an opening, a key member disposed to project inwardly of the housing through the opening and, a switch disposed to face the key member, a first member disposed inside the housing, and a waterproof member disposed to surround the opening while being sandwiched between an inner surface of the housing and the first member. The first member includes a projecting portion that projects to be away from the opening and is contactable with the switch when the key member is pressed.

8 Claims, 5 Drawing Sheets

ELECTRONIC DEVICE

CROSS-REFERENCE TO RELATED APPLICATION

The present application is the National Phase of PCT International Application No. PCT/JP2017/011732, filed on Mar. 23, 2017, which claims priority under 35 U.S.C. 119 (a) to Japanese Patent Application No. 2016-061538, filed on Mar. 25, 2016. PCT International Application No. PCT/JP2017/011732 is entitled "Electronic Device", and Japanese Patent Application No. 2016-061538 is entitled "Electronic Device". The content of which are incorporated by reference herein in their entirety.

FIELD

Embodiments of the present disclosure relate to an electronic device.

BACKGROUND

An example electronic device having a waterproof structure is known.

SUMMARY

Solution to Problem

An electronic device according to the present disclosure includes a housing including an opening, a key member disposed to project inwardly of the housing through the opening, a switch disposed to face the key member inside the housing; a first member disposed inside the housing, and a waterproof member disposed to surround the opening while being sandwiched between an inner surface of the housing and the first member. The first member includes a first portion including a projecting portion that projects to be away from the opening and is formed of an elastic material, and a second portion that is integrally continuous with the first portion and is formed of a material different from the elastic material for the first portion. The projecting portion includes a portion located between the key member and the switch. The waterproof member is in contact with the second portion.

DETAILED DESCRIPTION

Figure 1:
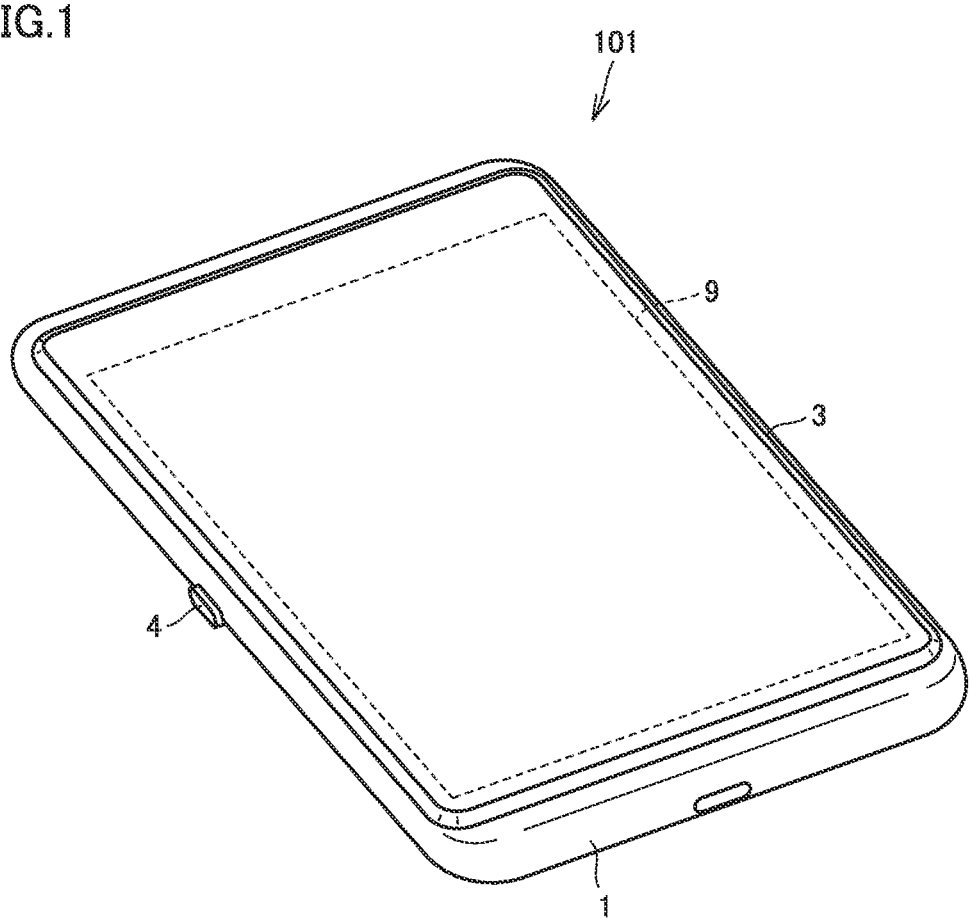
FIG. 1 is a perspective view of an electronic device in a first embodiment based on the present disclosure.

A dimensional ratio shown in the drawings does not necessarily faithfully represent an actual dimensional ratio and a dimensional ratio may be exaggerated for the sake of convenience of description. A concept above or upper or below or lower mentioned in the description below does not mean absolute above or upper or below or lower but may mean relative above or upper or below or lower in terms of a shown position.

First Embodiment

An electronic device in a first embodiment based on the present disclosure will be described with reference to FIGS. 1 to 4. FIG. 1 shows appearance of an electronic device 101 in the first embodiment. Electronic device 101 has a substantially rectangular outside shape when viewed from above. A cover glass 3 may be disposed on a main surface of electronic device 101. Cover glass 3 may be a plate-shaped glass component. A display 9 may be disposed below cover glass 3. Display 9 may be, for example, a liquid crystal display panel. A user can view display content of display 9 through cover glass 3. Electronic device 101 includes a housing 1. Housing 1 and cover glass 3 are combined together to constitute most of an outer shell of electronic device 101. A key member 4 is disposed on one side of housing 1. Key member 4 is to be pressed by the user. The user can operate electronic device 101 by pressing key member 4.

Although description is given here by assuming that electronic device 101 includes one key member 4 while focusing on key member 4 and therearound, one electronic device 101 may include a plurality of key members 4. This is also applicable to the second embodiment and the following embodiments.

Figure 2:
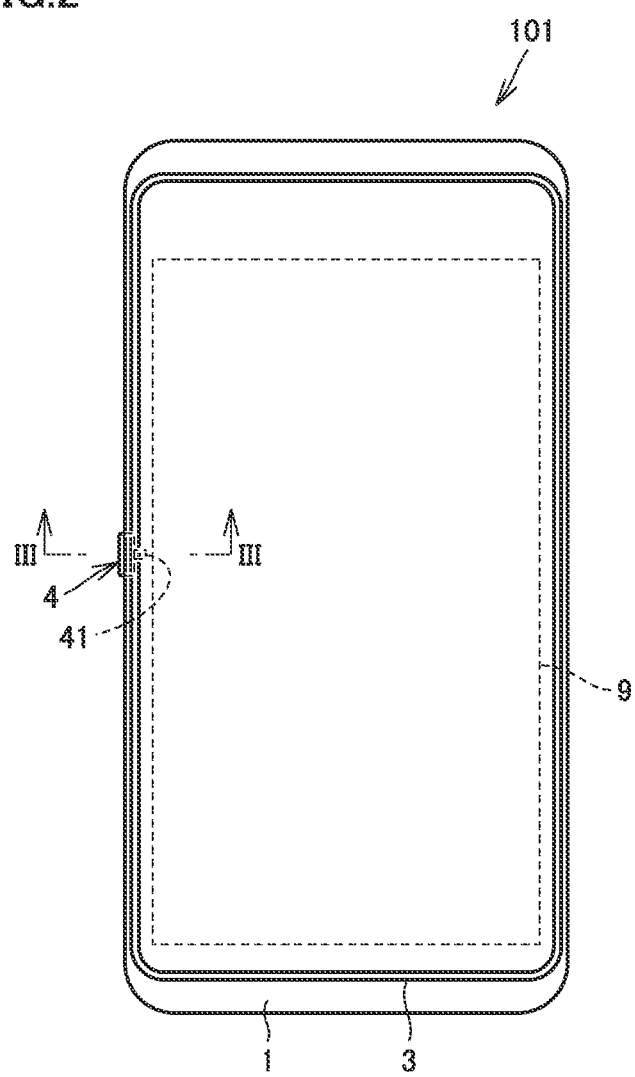
FIG. 2 is a plan view of the electronic device in the first embodiment based on the present disclosure.
Figure 3:
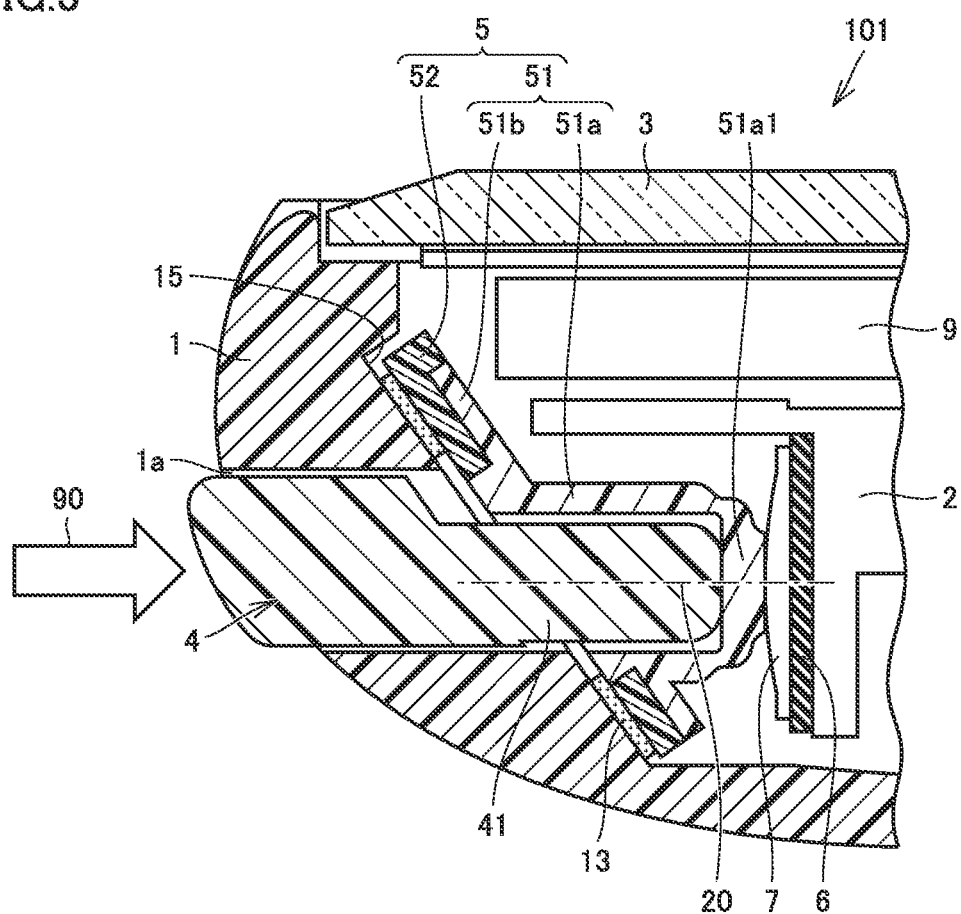
FIG. 3 is a cross-sectional view taken along the line in FIG. 2.
Figure 4:
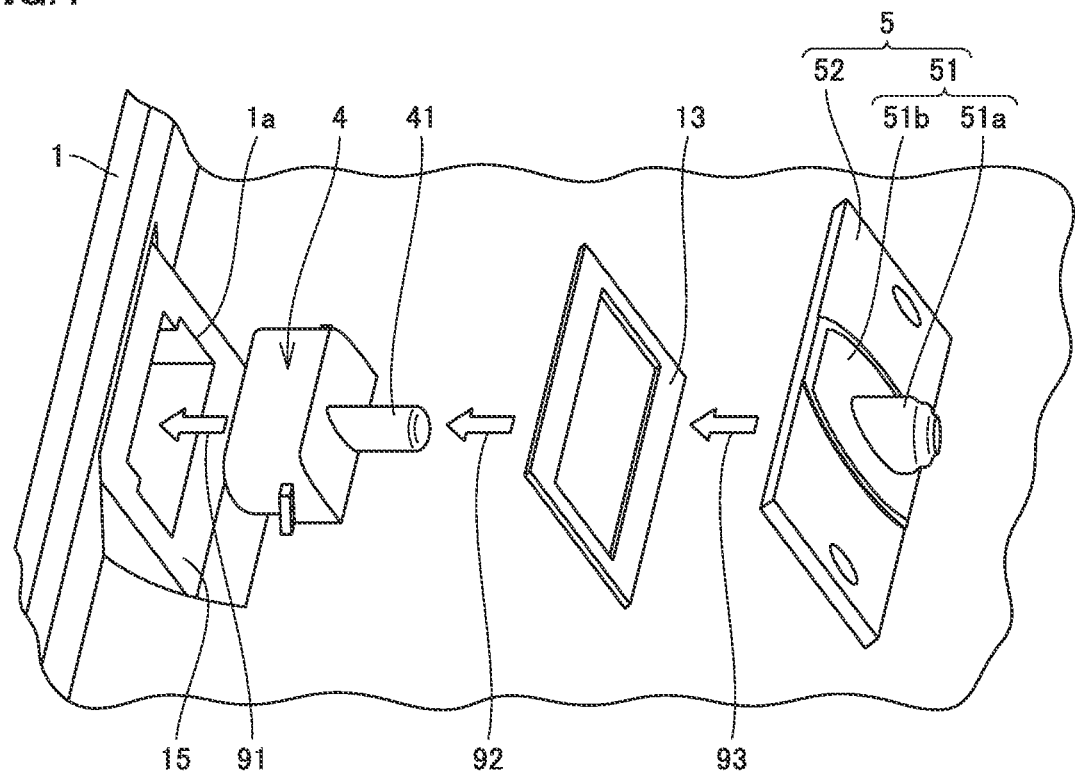
FIG. 4 shows how a key member and the like of the electronic device are attached to a housing in the first embodiment based on the present disclosure.

FIG. 2 shows electronic device 101 seen in plan view. In FIG. 2, key member 4 is disposed on the left side. Although the aspect ratio of the outside shape of housing 1 in FIG. 2 looks different from that in FIG. 1, the outside shape of housing 1 of electronic device 101 may have any aspect ratio. FIG. 3 is a cross-sectional view taken along the line in FIG. 2. Housing 1 accommodates display 9, an inner chassis 2, switch 7, and the like. Housing 1 has an opening 1a. Part of key member 4 is exposed to the outside of housing 1. FIG. 4 is an exploded view of key member 4 and the components therearound.

Electronic device 101 includes housing 1 having opening 1a, key member 4 disposed to project inwardly of housing 1 through opening 1a, switch 7 disposed to face key member 4 inside housing 1, a first member 5 disposed inside housing 1, and a waterproof member 13 disposed to surround opening 1a while being sandwiched between the inner surface of housing 1 and first member 5. As shown in FIG. 4, waterproof member 13 may have an annular shape. Although waterproof member 13 has a rectangular annular shape in FIG. 4, the shape of waterproof member 13 is not limited to a rectangular shape and may be, for example, a circular shape or any other annular shape. Although waterproof member 13 may be a component provided in a solid state, the initial state of waterproof member 13 is not limited to the solid state. Waterproof member 13 may be, for example, a waterproof adhesive or the like arranged in such a shape. First member 5 includes a projecting portion 51a contactable with switch 7 when key member 4 is pressed. Projecting portion 51a projects to be away from opening 1a.

First member 5 may include a first portion 51 and a second portion 52. First portion 51 may be formed of an elastic material. First portion 51 may include projecting portion 51*a*. Second portion 52 may be integrally continuous with first portion 51. Second portion 52 may be formed of a material different from the material for first portion 51. As shown in FIG. 3, projecting portion 51*a* may include a portion 51*a*1 located between key member 4 and switch 7. First portion 51 and second portion 52 may be formed integrally. First member 5 may be obtained by two-color molding. Waterproof member 13 may be in contact with second portion 52.

Key member 4 may be formed of, for example, resin. In the example shown in FIG. 3, key member 4 includes a pusher 41. Pusher 41 projects inwardly of housing 1. Pusher 41 is covered with bag-shaped projecting portion 51*a*.

As shown in FIG. 3, switch 7 may be disposed on the surface of a flexible substrate 6. Flexible substrate 6 may be disposed on the end surface of inner chassis 2. Switch 7 faces pusher 41. Switch 7 may be a dome switch. Herein, the dome switch may be, for example, a metal dome switch. Key member 4 is pressed to advance pusher 41, thus pressing switch 7.

As shown in FIG. 4, key member 4 may be inserted from inside of housing 1. Housing 1 may include an inclined surface 15 inside thereof. Waterproof member 13 is attached to inclined surface 15. Waterproof member 13 is sandwiched between inclined surface 15 of housing 1 and second portion 52 of first member 5. Waterproof member 13 may have opposite adhesive surfaces. Waterproof member 13 may bond inclined surface 15 of housing 1 and second portion 52 of first member 5 to each other.

In the first embodiment, key member 4 is disposed to pass through opening 1*a* of housing 1, and first member 5 and waterproof member 13 can achieve waterproof performance. This enables an electronic device including operation keys to be appropriately disposed in a limited space of a housing while achieving some extent of waterproof performance. Further, as described in the first embodiment, the use of first member 5 including first portion 51 and second portion 52 can easily achieve waterproof performance with a limited number of components. Adjusting the design of the shape of first member 5 can change the direction of key member 4, leading to an increased degree of design flexibility.

In the first embodiment, first portion 51 of first member 5 is formed of an elastic material, allowing first portion 51 to easily deform following key member 4 as key member 4 is pressed to deform. Projecting portion 51*a*, which is part of first portion 51 of first member 5, includes portion 51*a*1 located between key member 4 and switch 7, allowing key member 4 to abut against the switch with portion 51*a*1 formed of elastic material therebetween. A degree of abrasion, fatigue, damage, or the like of key member 4 and switch 7 can accordingly be mitigated even after the switch has been pressed many times.

Since first member 5 is composed of portions formed of two types of materials, namely, first portion 51 and second portion 52, integrally combined together, the flexibility of following key member 4 can be achieved by first portion 51, and the compatibility for excellent bonding with waterproof member 13 can be achieved by second portion 52. Even when a material suitable for bonding with waterproof member 13 cannot be found from among the types of materials having a desired degree of elasticity, the use of first member 5 that is a combination of two types of materials as described above can ensure waterproof performance in the vicinity of key member 4.

As shown in FIG. 3, projecting portion 51*a* has a bag shape, and at least part of key member 4 may be covered with projecting portion 51*a*. This configuration allows at least part of key member 4 to be reliably wrapped in first portion 51, achieving waterproof performance. This configuration is easily compatible even when pusher 41 of key member 4 is long.

As shown in FIG. 3, second portion 52 has a flat plate shape, and projecting portion 51*a* may be provided such that a center line 20 of projecting portion 51*a* obliquely intersects a surface of second portion 52. This configuration is also compatible with a structure in which the advancing direction of pusher 41 of key member 4 is oblique to the surface of second portion 52. Inclined surface 15 is provided also in a limited space inside housing 1 and second portion 52 is attached to inside surface 15, thus allowing pusher 41 of key member 4 to advance in a desired direction. Inclined surface 15 shown in FIG. 3 is merely an example, and the size, angle, and shape of an inclined surface to which second portion 52 is attached are not limited to those described herein.

As described in the first embodiment, first member 5 may be an integrally molded product. Adoption of this configuration suppresses an increase in the number of components. Since first member 5 is an integrally molded product, water leakage at the interface between first portion 51 and second portion 52 can be avoided as much as possible.

Figure 5:
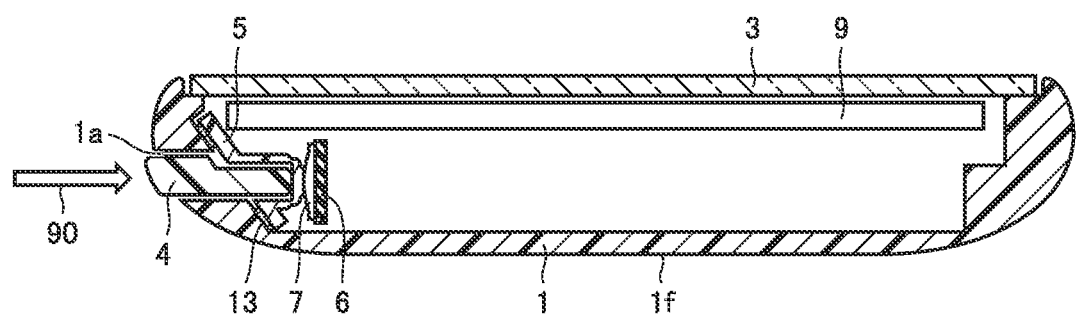
FIG. 5 illustrates a relationship between the surface direction of a main surface of the electronic device and the pressing direction of the key member in the first embodiment based on the present disclosure.

As shown in FIG. 5, housing 1 has a main surface 1*f*, and key member 4 may be disposed to press switch 7 via first member 5 by being pressed parallel to main surface 1*f*. Adoption of this configuration simply requires the user to press key member 4 parallel to main surface 1*f* of housing 1 when the user attempts to operate the electronic device with a press button including key member 4, making the electronic device to be easily operated by the user.

As shown in FIG. 5, display 9 is disposed inside housing 1, and main surface 1*f* may be a surface parallel to the screen of display 9. Adoption of this configuration simply requires a user to press key member 4 so as to press key member 4 from a lateral side of display 9 while viewing the content displayed on display 9, making the electronic device to be easily operated by the user.

As shown in FIG. 5, housing 1 may be formed of a single component. A housing formed of a single component can reduce the number of components of the entire electronic device. Also when a housing is formed of a single component, adoption of the configuration as described in the first embodiment can achieve an electronic device including operation keys appropriately disposed in a limited space of the housing while achieving some degree of waterproof performance.

Second Embodiment

Figure 6:
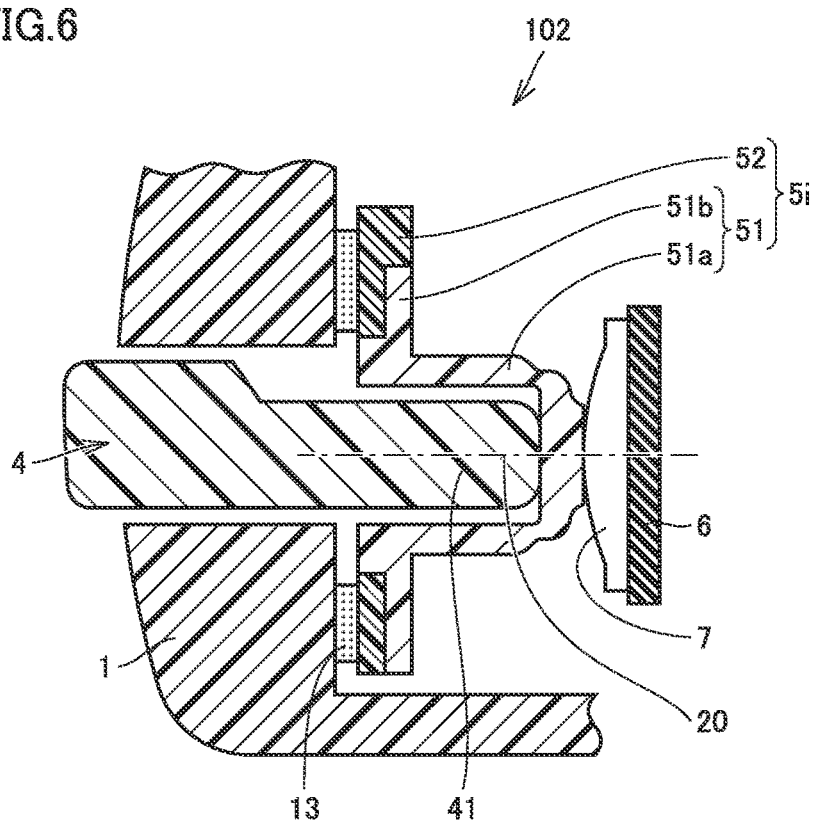
FIG. 6 is an enlarged cross-sectional view of a key member of an electronic device and therearound in a second embodiment based on the present disclosure.

An electronic device in a second embodiment based on the present disclosure will be described with reference to FIG. 6. FIG. 6 is an enlarged cross-sectional view of key member 4 of an electronic device 102 and therearound in the second embodiment. Electronic device 102 is similar to electronic device 101 described in the first embodiment in basic configuration but differs from electronic device 101 in the following respects.

Electronic device 102 includes a first member 5*i*. First member 5*i* includes first portion 51 and second portion 52. First portion 51 includes projecting portion 51*a*. In first member 5*i*, center line 20 of projecting portion 51*a* is perpendicular to second portion 52.

In the second embodiment, first member 5i and waterproof member 13 can achieve waterproof performance. The second embodiment can also achieve effects similar to those of the first embodiment. The second embodiment is appropriately compatible when the advancing direction of pusher 41 of key member 4 is perpendicular to second portion 52 of first member 5i.

Third Embodiment

Figure 7:
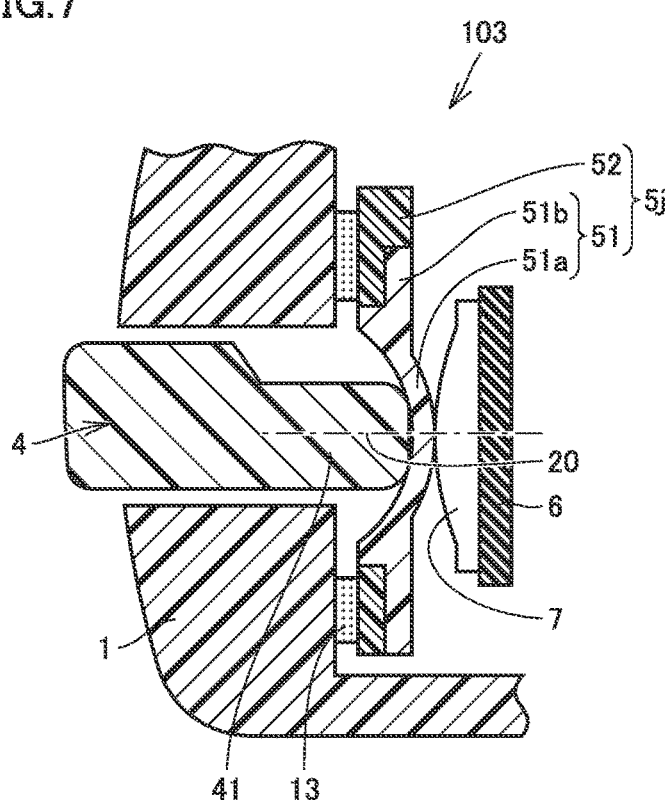
FIG. 7 is an enlarged cross-sectional view of a key member of an electronic device and therearound in a third embodiment based on the present disclosure.

An electronic device in a third embodiment based on the present disclosure will be described with reference to FIG. 7. FIG. 7 is an enlarged cross-sectional view of a key member of an electronic device 103 and therearound in the third embodiment. Electronic device 103 is similar to electronic device 102 described in the second embodiment in basic configuration but differs from electronic device 102 in the following respects.

Electronic device 103 includes a first member 5j. First member 5j includes first portion 51 and second portion 52. First portion 51 includes projecting portion 51a. Although projecting portion 51a may not be referred to as having a bag shape in first member 5j, it has at least a projecting shape. In the example described herein, projecting portion 51a has a curved surface.

In the third embodiment, first member 5j and waterproof member 13 can achieve waterproof performance. The third embodiment can also achieve effects similar to those of the first embodiment. When the distance from a surface of key member 4 which is touched by the user to switch 7 is short, the configuration as described in the third embodiment may be useful.

Although the respective embodiments have described examples in which an electronic device has a substantially rectangular outside shape when viewed from above, the electronic device may have any outside shape other than a rectangular shape when viewed from above.

Some features in embodiments above may be adopted as being combined as appropriate.

Although description has been given so far by using the term "electronic device," the electronic device is a broad concept covering, for example, a portable telephone, a portable information terminal, a tablet terminal, a personal computer, a game console, a television receiver, a portable music player, a CD player, a DVD player, an electronic calculator, an electronic organizer, an electronic dictionary, an electronic book reader, a digital camera, a video camera, a radio receiver, a navigation system, and a measurement instrument. The concept of the portable telephone or the portable information terminal includes a smartphone.

Although embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

The invention claimed is:

1. An electronic device comprising:
a housing including an opening;
a key member disposed to project inwardly of the housing through the opening;
a switch disposed to face the key member inside the housing;
a first member disposed inside the housing; and
a waterproof member disposed to surround the opening while being sandwiched between an inner surface of the housing and the first member, wherein
the first member includes
a projecting portion, the projecting portion projecting to be away from the opening and contactable with the switch when the key member is pressed,
a first portion formed of an elastic member, and
a second portion formed of a material different from the elastic material for the first portion, and
the waterproof member is in contact with the second portion.

2. An electronic device comprising:
a housing including an opening;
a key member disposed to project inwardly of the housing through the opening and;
a switch disposed to face the key member inside the housing;
a first member disposed inside the housing; and
a waterproof member disposed to surround the opening while being sandwiched between an inner surface of the housing and the first member,
the first member including a projecting portion, the projecting portion projecting to be away from the opening and contactable with the switch when the key member is pressed, wherein
the first member includes
a first portion including the projecting portion and formed of an elastic material, and
a second portion integrally continuous with the first portion and formed of a material different from the elastic material for the first portion,
the projecting portion includes a portion located between the key member and the switch, and
the waterproof member is in contact with the second portion.

3. The electronic device according to claim 1, wherein the projecting portion has a bag shape, and
at least part of the key member is covered with the projecting portion.

4. The electronic device according to claim 2, wherein the projecting portion has a bag shape,
at least part of the key member is covered with the projecting portion,
the second portion has a flat plate shape, and
the projecting portion is provided such that a center line of the projecting portion obliquely intersects a surface of the second portion.

5. The electronic device according to claim 1, wherein the first member is an integrally molded product.

6. The electronic device according to claim 1, wherein the housing has a main surface, and
the key member is disposed to press the switch via the first member by being pressed parallel to the main surface.

7. The electronic device according to claim 6, wherein a display is disposed inside the housing, and
the main surface is a surface parallel to a screen of the display.

8. The electronic device according to claim 1, wherein the housing is formed of a single component.

* * * * *